United States Patent [19]

Tsukada et al.

[11] Patent Number: 4,496,951
[45] Date of Patent: Jan. 29, 1985

[54] HYPERBOLIC NAVIGATION RECEIVER

[75] Inventors: Kazuo Tsukada, Kakogawa; Yoshiharu Kanzaki, Sagamihara; Yoshikazu Hori, Yokohama, all of Japan

[73] Assignee: Fujitsu Limited, Kawasaki, Japan

[21] Appl. No.: 336,327

[22] Filed: Dec. 31, 1981

[30] Foreign Application Priority Data

Jan. 17, 1981 [JP] Japan .................................. 56-5667

[51] Int. Cl.³ ............................................. G01S 1/30
[52] U.S. Cl. ................................................. 343/394
[58] Field of Search ............... 343/394, 396, 395, 397; 364/449

[56] References Cited

U.S. PATENT DOCUMENTS

| | | | |
|---|---|---|---|
| 3,117,319 | 1/1964 | Stover | 343/395 X |
| 3,214,759 | 10/1965 | Mahoney | 343/395 |
| 3,725,932 | 4/1973 | Hughes | 343/395 X |
| 3,818,477 | 6/1974 | Odans | 343/396 |
| 3,928,852 | 10/1975 | Barker | 343/396 |
| 3,936,828 | 2/1976 | Muess et al. | 343/394 |
| 3,983,559 | 9/1976 | Honore et al. | 343/395 X |
| 3,996,515 | 12/1976 | Baltzer et al. | 343/396 X |
| 4,114,155 | 9/1978 | Raab | 343/394 |

Primary Examiner—Theodore M. Blum
Assistant Examiner—Brian Steinberger
Attorney, Agent, or Firm—Daniel Jay Tick

[57] ABSTRACT

A hyperbolic navigation receiver locates ships, and the like, by phase-locking the output signal of the voltage-controlled oscillator or voltage-controlled phase shifter of respectively provided tracking loop filters corresponding to the incoming signals from a master and slave station. The voltage-controlled oscillator or voltage-controlled phase shifter is caused to produce an output signal which is a multiple frequency of the incoming signal. Phase discrimination of the output signals is undertaken without the use of a multiplier.

5 Claims, 7 Drawing Figures

MULTIPLIER-PHASE SHIFTER CIRCUIT 66

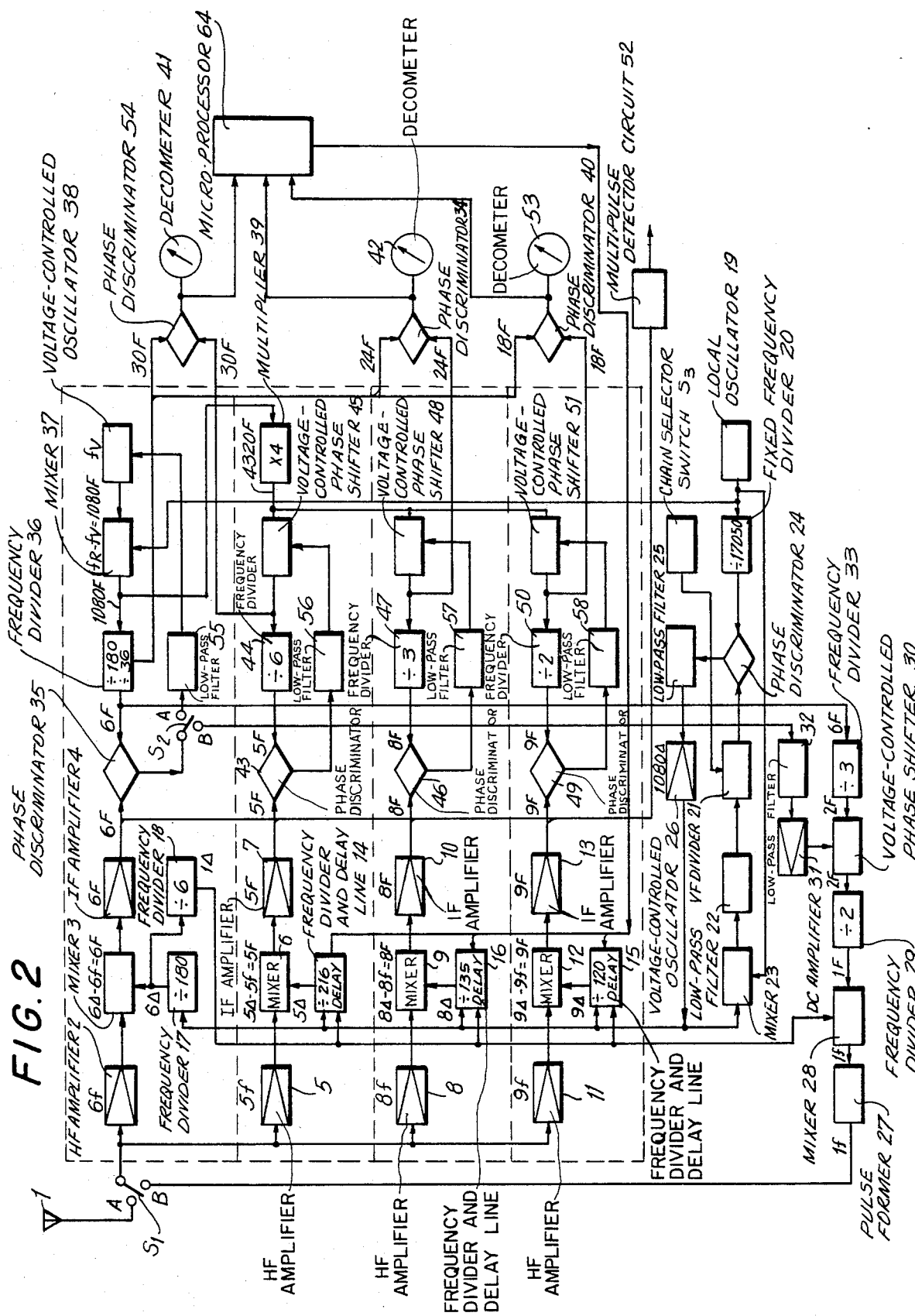

FIG. 5
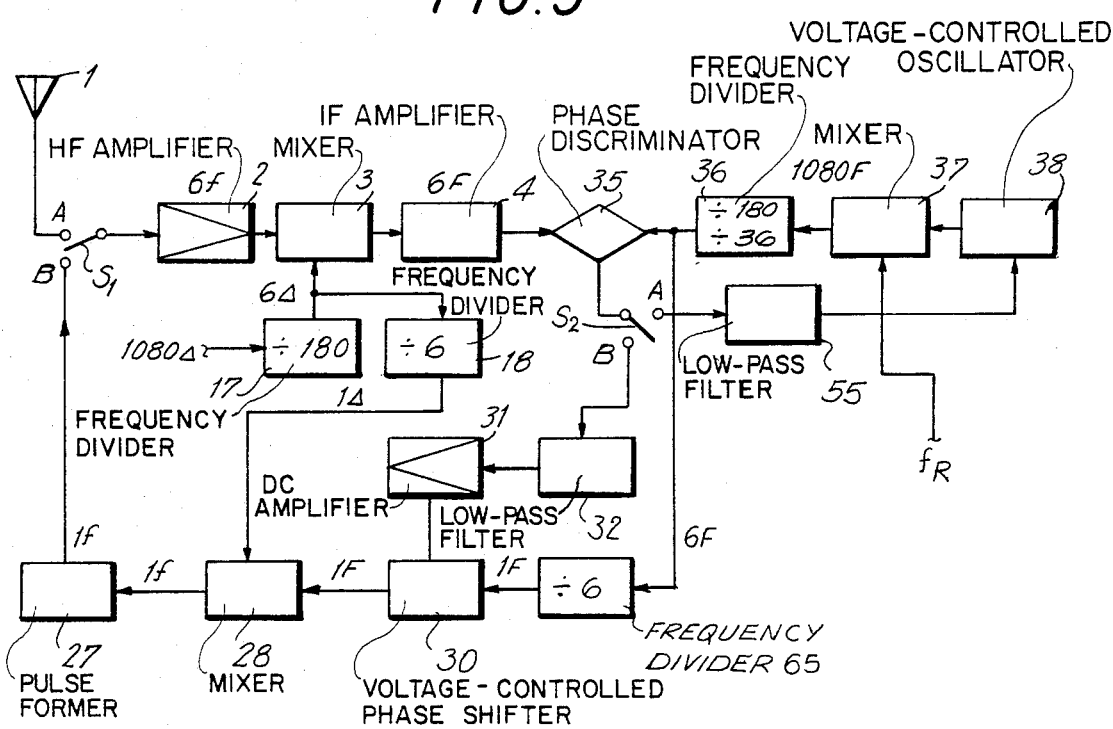
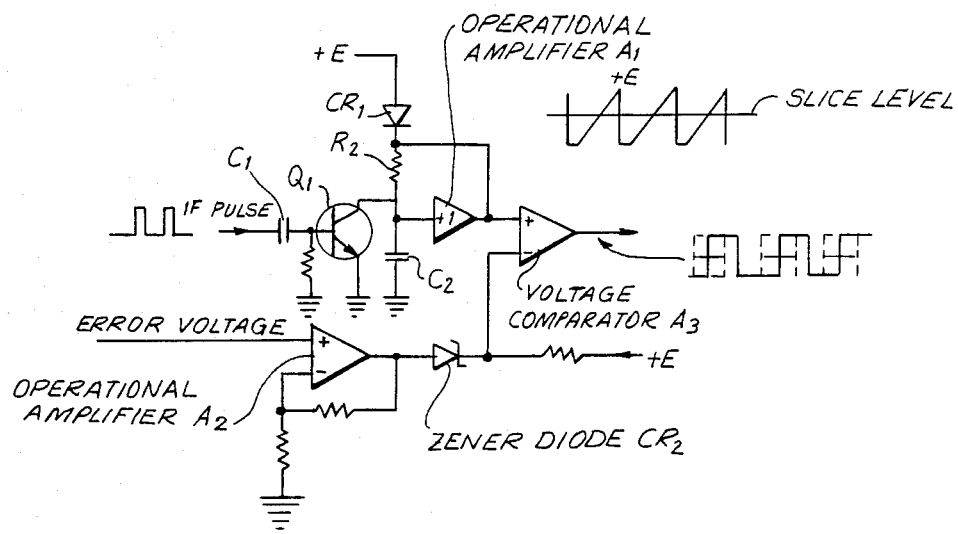
FIG. 6 the voltage-controlled oscillator, therefore enabling economy and a drastic reduction in size of the receiver as a whole.

In addition, a loop functioning as the tracking loop filter of the voltage-controlled oscillators provided for the master and slave receiving means is disconnected and is used for the generation of a 1$f$ pulse for reference as the local oscillator. More specifically, in the phase discrimination system of the invention, a voltage-controlled phase shifter is provided in order to control the phase relation, just before "REFERENCE", between the oscillator output and the received signal, or the signal obtained by converting such received signal, or the signal obtained by converting such received signal to the intermediate frequency. This eliminates the use of the oscillator only for reference.

The M$\Delta$ signal used for conversion of the received signal to the intermediate frequency is generated by dividing the multiple frequencies of the M$\Delta$ signal mixed at master and slave receiving means. $\Delta$ is the basic frequency and M is an integer. Therefore, a zero adjust system providing no phase drift in the reference circuit itself may be provided, where the multiplier used for multiplying the 1$\Delta$ signal to the specified M$\Delta$ signal is no longer required. The high frequency transformer tuning circuit shown in FIG. 1b is also eliminated. The hyperbolic navigation receiver of the invention successfully provides frequency division via a small sized and economical circuit having no drift such as, for example, counters, and obtains the specified M$\Delta$ output. Simultaneously, a digital signal may also be controlled from the microprocessor for zero adjustment at the time of "reference".

HYPERBOLIC NAVIGATION RECEIVER

BACKGROUND OF THE INVENTION

The present invention relates to a hyperbolic navigation receiver. More particularly, the invention relates to a receiver of a hyperbolic navigation system wherein a ship, or the like, is located by phase differences between long wave signals emitted from master and slave stations.

More specifically, the invention relates to a phase discrimination system which does not require a multiplier and a phase reference system which does not require a reference oscillator.

The principal object of the invention is to provide a hyperbolic navigation receiver which utilizes the same incoming frequency without utilizing a multiplier, as required by prior art receivers, for the output of master and slave receiving means corresponding to the master and slave stations and to perform phase discrimination.

An object of the invention is to provide a hyperbolic navigation receiver in which multifrequency signals of a basic frequency 1$\Delta$ are generated without the use of a multiplier, as required by prior art receivers, and to convert the received signal to an intermediate frequency.

Another object of the invention is to provide a hyperbolic navigation receiver which includes a phase discrimination system which does not require a voltage-controlled oscillator, as required by prior art receivers, for reference and phase discrimination.

Still another object of the invention is to provide a hyperbolic navigation receiver which includes a reference circuit without any phase drift in the reference circuit itself, without a variable capacitance, as required by prior art receivers.

BRIEF SUMMARY OF THE INVENTION

In the hyperbolic navigation receiver of the invention, multiplication at the time of phase discrimination is no longer required, due to the use of an oscillator which generates the multiple frequencies of the received signal or of the signal obtained by converting the receiving signal to the intermediate frequency. Furthermore, upon the synchronizing of the signal obtained by converting the received signal to the intermediate frequency with the oscillator output, the oscillator output is divided, the phases of these signals are discriminated, thereby forming a tracking loop filter. Therefore, the multiplier which has been utilized in the known systems for phase discrimination at the same frequency is no longer required.

The hyperbolic navigation receiver of the invention requires no voltage-controlled oscillator for the receiving means corresponding to the master station and the slave stations, respectively. Thus, for example, a voltage-controlled oscillator which generates the multiple frequencies of the received signal, or the signal obtained by converting the received signal to the intermediate frequency, is provided only for the master receiving means corresponding to the master station, while a voltage-controlled phase shifter which controls the phase of the output of said voltage-controlled oscillator in accordance with a phase difference of the received signal, or the signal obtained by converting the received signal to the intermediate frequency, may be provided for the slave receiving means. The voltage-controlled phase shifter is more economical and smaller in size than

BRIEF DESCRIPTION OF THE DRAWINGS

In order that the invention may be readily carried into effect, it will now be described with reference to the accompanying drawings, wherein:

FIG. 1b is a circuit diagram of an embodiment of the multiplier-phase shifter circuit 66 of the prior art used in the receiver of FIG. 1a;

FIG. 2 is a block diagram of an embodiment of the hyperbolic navigation receiver of the invention;

FIG. 5 is a block diagram of an embodiment of the phase discrimination system of the receiver of FIG. 2; and FIG. 6 is a circuit diagram of an embodiment of the voltage-controlled phase shifter 30 of the receiver of FIG. 2.

DETAILED DESCRIPTION OF A PREFERRED EMBODIMENT OF THE INVENTION

A known navigation system utilizing a phase discrimination system related to that of the invention is hereinafter explained.

Figure 1A:
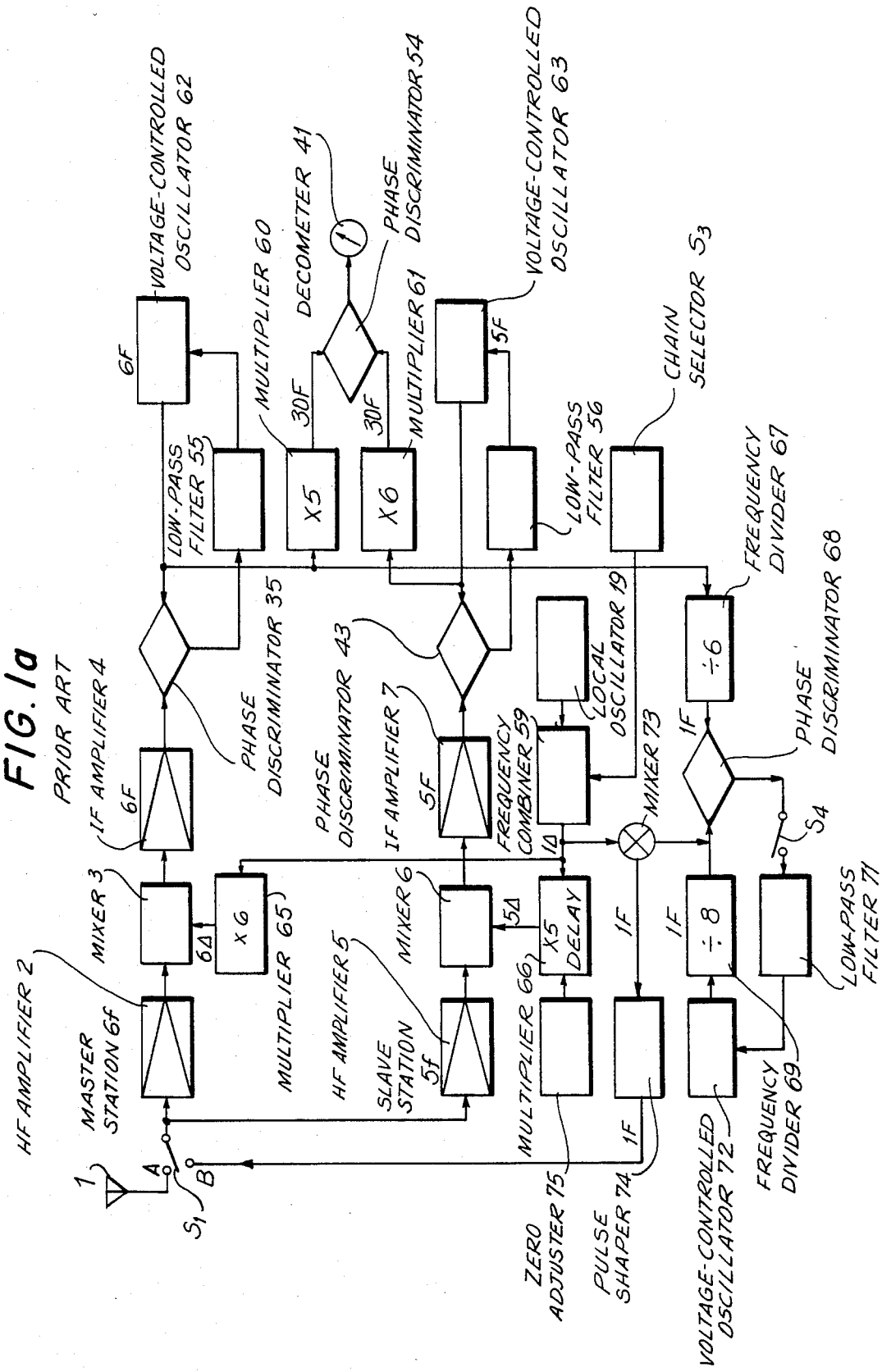
FIG. 1a is a block diagram of an embodiment of a navigation receiver of the prior art.
Figure 1B:
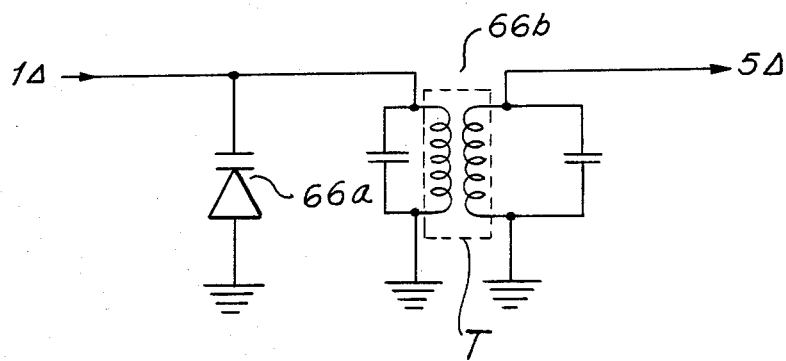

In the navigation system of the prior art, shown in FIGS. 1a and 1b, a chain is ordinarily composed of one master station and a plurality of corresponding slave stations such as, for example, a red station, a green station and a purple station, for a total of three slave stations. The slave stations are arranged in the form of a star around the master station. Each of the master station and the plurality of slave stations transmits a continuous multiple frequency wave derived from the basic frequency $1f$ of about 14 kHz. The frequency of the master station is $6f$ and those of the slave stations are $5f$, $8f$ and $9f$, respectively. A receiver multiplies the signals transmitted from the master and slave stations up to the least common multiple, making the signal frequencies to be discriminated equal, and discriminates the phases of signals transmitted from the master station and slave stations. More particularly, three hyperbolas, having comparison frequencies of $24f$, $18f$ and $30f$, are obtained and the location of a ship, or the like, is derived from the intersecting points of these hyperbolas.

As hereinbefore explained, in the known phase discrimination system for a receiver, the received signal is multiplied up to the frequency of the least common multiple, and thereafter the incoming signal is phase-discriminated.

FIG. 1a is a block diagram of a receiver of the prior art. The phase discrimination system for this receiver is explained with reference to FIG. 1a, which illustrates only the phase discrimination of received frequencies of $6f$ and $5f$. In an ordinary receiver, however, the phase discrimination of received frequencies of $6f$ and $8f$, and $6f$ and $9f$ is carried out by a similar phase discrimination system.

A received incoming signal of an antenna 1 is fed to high frequency amplifiers 2 and 5. The amplifiers 2 and 5 respectively amplify the signal $6f$ transmitted from the master station and the signal $5f$ transmitted from the slave stations, selectively, and then feed the amplified signals to the mixers 3 and 6, respectively.

In FIG. 1a, a local oscillator 19 generates, for example, a signal of frequency $M\Delta$. The signal $M\Delta$ is then fed to a frequency combiner 59 and therein divided into $1/M$, and pulseformed. Thereafter, the signal is mixed with the signal from a chain selector S3 and converted into a pulse signal of frequency $1\Delta$. Multipliers 65 and 66 multiply the pulse signal $1\Delta$ 6 times and 5 times, respectively. The generated signals of frequencies $6\Delta$ and $5\Delta$ are applied to the mixers 3 and 6, respectively. The mixers 3 and 6 generate signals 6F and 5F, respectively. The signal 5F equals $6\Delta - 6f$ and the signal 5F equals $5\Delta - 5f$, which are the difference frequencies. The signals 5F and 6F are fed to intermediate frequency amplifiers 4 and 7, respectively. F is the basic intermediate frequency, providing the relation $F = \Delta - f$.

The intermediate frequency amplifiers 4 and 7 amplify the intermediate frequency signals 6F and 5F, respectively, and feed them to phase discriminators 35 and 43, respectively. The phase discriminators 35 and 43 phase-discriminate the intermediate frequency signals 6F and 5F, respectively, with the output signal of frequency 6F of the voltage-controlled oscillator 62 and the output signal of frequency 5F of the voltage-controlled oscillator 63, and then produce output signals corresponding to the respective phase differences. The phase difference output signals of the phase discriminators 35 and 43 are smoothed by low-pass filters 55 and 56, respectively, then fed back to the voltage-controlled oscillators 62 and 63, respectively. The oscillation frequency of each voltage-controlled oscillator is thereby controlled so that respective phase difference output signals come close to zero.

As hereinbefore explained, the outputs 6F and 5F of the voltage-controlled oscillators 62 and 63, respectively, are phase-locked to the intermediate frequency signals 6F and 5F from IF amplifier 4 and 7, respectively. The phase discriminator 35, voltage-controlled oscillator 62 and low-pass filter 55, as well as the phase discriminator 43, voltage-controlled oscillator 63 and low-pass filter 56, respectively, operate as a narrow band tracking loop filter.

The output signals 6F and 5F of the voltage-controlled oscillators 62 and 63 are respectively multiplied 5 times and 6 times by multipliers 60 and 61, respectively, and a signal of frequency 30F can be obtained. The 30F output signal of each of the multipliers 60 and 61 is phase-discriminated by the phase discriminator 54, providing an output corresponding to a phase difference which is displayed on the decometer 41.

As hereinbefore explained, the phase discrimination system used in the receiver of the prior art realizes the phase discrimination after multiplying each received signal frequency to the least common multiple of the basic frequency. The phase discrimination system is the method of phase comparison between the signal from the master station and the signals from the slave stations. Therefore, in the known phase discrimination system, multiplier circuits are necessary for master and slave receiving means corresponding to each frequency of the master and slave stations.

FIG. 1b shows an example of the multiplier-phase shifter circuit 66 of FIG. 1a. The circuit of FIG. 1b includes a variable capacitor 66a and a transformer T which electrically couples two tuning circuits 66b. The phase of the input pulse $1\Delta$ is shifted by controlling the bias voltage of the variable capacitor 66a and the desired multifrequency or multiple frequency signal is extracted from the multiple frequencies of this pulse signal via the tuning circuit 66b.

As hereinbefore explained, the receiver of the prior art uses the multiplier of FIG. 1b and has the following disadvantages.

(1) Phase drift accompanied by temperature change and aging fluctuation occurs easily. That is, phase drift inevitably occurs due to the fluctuation of the tuning frequency based on temperature change and aging fluctuation of the tuning circuit 66b of FIG. 1b, usually forming an LC filter.

(2) The system is expensive and difficult to reduce in size. The tuning circuit for extracting multifrequency signals requires accurate phase adjustment and therefore usually obtains the desired characteristics by adjusting the amplitude and phase of the output, using a variable tuning type filter. It is therefore difficult to realize adjustment-free operation, and the system itself becomes expensive. This tuning circuit has different dimensions in accordance with the frequency used, but the receiver utilizes the frequency of the long wave signal and it is accordingly very difficult to realize a reduction in size.

The necessity of a phase reference and reference in the hyperbolic navigation receiver is hereinafter explained. In the hyperbolic navigation system of the invention, the location of a ship, or the like, is determined by phase differences of signals from the master station and slave stations. Therefore, when the receiver is isolated from the master station and slave stations, respectively, by a distance which is an integer times the wavelength of the transmitted signal and receives the signals from both stations in the same phase, the decometer of the receiver must show a zero-phase difference on account of the adjustment.

Accordingly, the phase reference of the receiver is actually carried out prior to the measurement or determination of the phase difference. As a practical means, a phase reference signal consisting of a sharp pulse of frequency 1$f$, which equalizes all the phases of multiple frequency, is fed to the receiving input terminal. The oscillation signal phase of each received signal corresponding to each station is adjusted so that the 5$f$, 6$f$, 8$f$ and 9$f$ multifrequency signals are selectively amplified from the 1$f$ input signal and each decometer indicates a zero phase difference.

A switch $S_1$ of FIG. 1$a$ functions to select "OPERATION" and "REFERENCE". When the switch $S_1$ is set to make electrical contact with its contact or side A and the circuit is connected to the antenna 1, the system is ready for "operation", whereas when it is set to make electrical contact with its contact or side B and the circuit is connected to the pulse generator, the system is ready for "reference". A switch $S_4$ prepares the system for "operation" by connecting a phase discriminator 68 to a low-pass filter 71, or for "reference" by disconnecting said discriminator from said filter.

As hereinbefore explained, when the signals 6$f$ and 5$f$ to be input to master and slave receiving means corresponding to the master and slave stations are in the same phase, the 30F outputs, which are obtained by multiplying the intermediate frequency outputs 6F and 5F of master and slave receiving means 5 times and 6 times, respectively, must also be in the same phase.

In actual operation, however, a difference in shift within the master receiving means corresponding to the master station and the slave stations does not always place the 30F outputs in the same phase. Thus, the phase of the intermediate frequency signal 5F is calibrated by adjusting the phase of the pulse signal 5Δ through the control of the multiplier-phase shifter circuit 66 by a zero adjuster 75. The phase of the output 30F of the multiplier 61 is thereby phase-locked to the 30F signal of the master receiving means corresponding to the master station.

In the hyperbolic navigation system, the master station and slave stations particularly transmit the 1$f$ signal at times of decided intervals and a rough position setting is determined. Since a so-called "Lane Identification" is usually performed on the basis of the output of the preliminary stages of the phase discriminators 35 and 43, it is effective to utilize the method wherein the phase of the intermediate frequency signal 5F is controlled. The decided interval is the interval in accordance with the system time sequence for Lane Identification.

The phase reference signal generator circuit of FIG. 1$a$ is explained as follows. The phase reference signal generator circuit includes a voltage-controlled oscillator 72 which generates the frequency 8F, a ⅛ frequency divider 69, the phase discriminator 68, the low-pass filter 71, a 1/6 frequency divider 67, a mixer 73 and a pulse shaper 74. When the select switches $S_1$ and $S_4$ are set to their "OPERATION" sides, the voltage-controlled oscillator 72 oscillates, as in the case of the voltage-controlled oscillators 62 and 63, at the frequency 8F, thereby being phaselocked to the output signal 6F of the voltage-controlled oscillator 62 via the phase discriminator 68. The 8F signal does not influence the master receiving means corresponding to the master station and slave stations during operation.

When the receiver, via the switch $S_1$, is switched to "REFERENCE" from "OPERATION", the output of the phase discriminator 68 is disconnected from the oscillator 72. This causes the oscillator 72 to operate as a local oscillator which oscillates at the frequency and phase just before the switching to "REFERENCE". The output 8F of the voltage-controlled oscillator 72 is divided to 1F by the frequency divider 69 and then mixed in the mixer 73 with the local oscillation frequency 1Δ from the frequency combiner 59, providing the signal 1$f$. The signal 1$f$ provided by the mixer 73 is exactly the same as the basic frequency 1$f$ of the received signal and is converted to the narrow reference pulse having a frequency 1$f$ by the pulse shaper 74.

Since the multiple frequencies 5$f$, 6$f$, 8$f$ and 9$f$ of the reference pulse are at the same amplitude and same phase, respectively, the zero phase reference of the receiver can be attained by feeding these frequencies to the master and slave receiving means corresponding to the master and slave stations via the select switch $S_1$ and by setting the zero adjuster 75 so that the decometer 41 indicates zero phase.

The phase reference system of the known receiver has the following disadvantages.

(1) The voltage-controlled oscillator 72 is required only for reference and the phase discriminator 68 is required only for phase-locking said oscillator.

(2) Since the oscillator 72 operates freely in oscillation as a local oscillator during the "reference" operation, the drift of frequency and phase during calibration appears as an error in the signal. This results in calibration being carried out with a signal having a frequency different from the received signal 1$f$. The phase calibration is therefore inaccurate. In order to prevent such a phenomenon, an expensive, but stable, voltage-controlled type crystal-controlled oscillator is used as the voltage-controlled oscillator 72.

(3) An attempt to synchronize the voltage-controlled oscillator 72 with the voltage-controlled oscillator 62, with excellent stability for a wide ambient temperature range, is required to precisely control the temperature coefficient of respective crystal oscillation units. This causes the oscillator to be additionally expensive. Furthermore, the operation of the oscillator easily becomes unstable due to a difference in the temperature coefficient. More particularly, phase shift is provided in the known receiver by use of a variable capacitance such as the vari-cap of FIG. 1$b$ for calibration. The variable capacitance is expensive, however, because it must have excellent linearity. Furthermore, the temperature coefficient of the variable capacitance, etc. is generally large, so that a phase drift of the reference circuit itself also cannot be ignored.

As hereinbefore explained, the receiver of the prior art requires a multiplier and an expensive oscillator for phase reference and phase discrimination, which makes economy and a reduction in size difficult. It is therefore expected that an economical receiver of small size would be provided in a new system.

FIG. 2 illustrates an embodiment of the hyperbolic navigation system receiver of the invention. The receiver of the invention is small in size. More particularly, the receiver is ½ or less the size of the receiver of the prior art, so that it may be used easily for a small sized vessel, or the like. Furthermore, the receiver of the invention is automatic, so that precise adjustment and complicated operations are eliminated to the extent that even a beginner may operate the receiver easily.

The receiver of FIG. 2 includes a receiving antenna 1, a select switch $S_1$ which changes over the receiving antenna 1 and reference pulse $1f$, high frequency amplifiers 2, 5, 8 and 11 which selectively amplify the signal $6f$ of the master station, the signal $5f$ of the first slave station, the signal $8f$ of the second slave station and the signal $9f$ of the third slave station, mixers 3, 6, 9 and 12 which mix the signals from the high frequency amplifiers and the specified $M\Delta$ signals $6\Delta$, $5\Delta$, $8\Delta$ and $9\Delta$ and generate each intermediate frequency 6F, 5F, 8F and 9F and narrow band intermediate frequency amplifiers 4, 7, 10 and 13, the center frequency of which is equal to the intermediate frequency.

The receiver of FIG. 2 further includes a local oscillator 19 which generates the reference frequency of the local oscillation signal, a fixed frequency divider 20 of 1/17050, a phase discriminator 24 which outputs an error voltage according to the phase difference, low-pass filters 22 and 25, a voltage-controlled oscillator 26 which generates a frequency $1080\Delta$ in accordance with the error voltage, a mixer 23 and a variable frequency divider 21 which changes the frequency division ratio according to the control signal from a chain selector switch $S_3$.

The receiver of FIG. 2 further includes a frequency divider 14 of 1/216 which produces a signal of $5\Delta$ from $1080\Delta$ and a delay line, a frequency divider 15 of 1/120 which produces a signal of $9\Delta$ from $1080\Delta$ and a delay line, a frequency divider 16 of 1/135 which produces a signal of $8\Delta$ from $1080\Delta$ and a delay line, a frequency divider 17 of 1/180 which generates a signal of $6\Delta$ from $1080\Delta$ and a frequency divider 18 of 1/6. A switch $S_2$ selects the operation and reference modes.

The receiver of FIG. 2 also includes a DC amplifier 31, a $\frac{1}{3}$ frequency divider 33, a voltage-controlled phase shifter 30 which is controlled by the error voltage and outputs a shifted signal of 2F, a $\frac{1}{2}$ frequency divider 29, a mixer 28 which produces a $1f$ signal from the $1f$ and $1\Delta$ and a $1f$ pulse former 27 which generates the narrow pulse of $1f$. The receiver of FIG. 2 includes 6F, 5F, 8F and 9F phase discriminators 35, 43, 46 and 49, respectively, which discriminate an intermediate frequency output and a tracking loop filter output, frequency dividers 36, 44, 47 and 50 and a mixer 37 which mixes the output of the local oscillator 19 and the output of the voltage-controlled oscillator 38.

The frequency drift of the local oscillator 19 is substantially cancelled between both inputs of the phase discriminators 35, 43, 46 and 49. More particularly, the frequency drifts of the local oscillator 19 are mixed in the mixer 37, generating the specified intermediate frequency signal and the $1080\Delta$ signal via the phase discriminator 24, low-pass filter 25 and voltage-controlled oscillator 26. The frequency drift of the local oscillator 19 is therefore also included in each $M\Delta$ signal fed as input to the mixers 3, 6, 9 and 12. As a result, the frequency drift of the local oscillator 19 is generated in the converted intermediate frequency signal in the master and slave receiving means. However, as hereinbefore explained, the frequency drift is also included in the intermediate frequency signals which are outputs of the frequency dividers 36, 44, 47 and 50, and the frequency drifts included in both signals discriminated by the phase discriminators 35, 43, 46 and 49 are mutually cancelled.

Specifically, the frequency drifts may be cancelled by inputting the output signal of the mixer 37 to the voltage-controlled phase shifters 45, 48 and 51, provided for the slave receiving means corresponding to each slave station, and using it as the oscillation output source at all the receiving means. As a result, in the embodiment of FIG. 2, the 4 time multiplier 39, the $1/144\pm 1$ variable divider-phase shifter 45, the $1/180\pm 1$ variable divider-phase shifter 48 and the $1/240\pm 1$ variable divider-phase shifter 51 are respectively provided for master and slave receiving means. The output 1080F of the mixer 37 is divided into the specified 30F, 24F and 18F signals and output in the same phase as the output of respective receiving channels.

The multipulse detector circuit 52 of FIG. 2 obtains the 1F output from the multipulse signal combining the intermediate frequency outputs of 6F, 5F, 8F and 9F. The output of the multipulse detector circuit 52 is used for the so-called Lane Identification in the hyperbolic navigation system of the phase discrimination system. Phase discriminators 54, 34 and 40 are for 30F, 24F and 18F, respectively. A microprocessor provides control and signal processing. The output of the microprocessor 64 is input to the frequency dividers 14, 15 and 16, thus controlling zero adjustment initially during the reference mode with the digital signal. The receiver of FIG. 2 includes decometers 41, 42 and 53.

Figure 3:
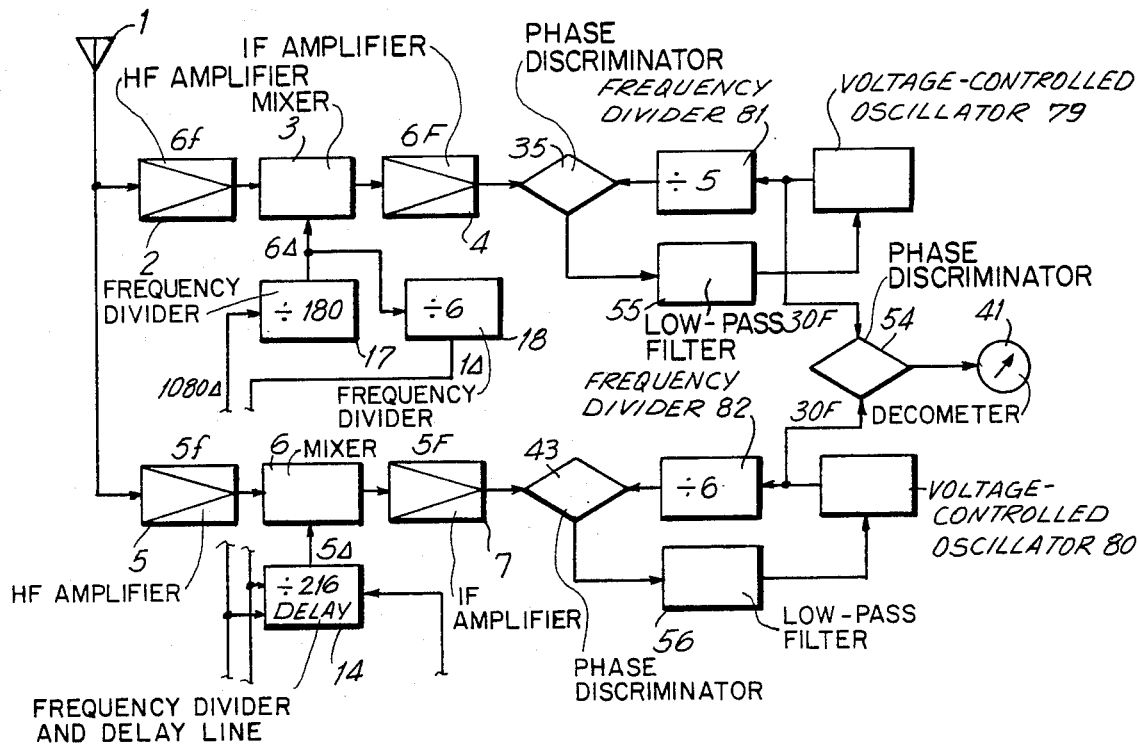
FIG. 3 is a block diagram of an embodiment of the phase discrimination system between the master and slave receiving means corresponding to the master and slave stations of the receiver of FIG. 2.

The phase discrimination system of the receiver of the invention is explained with reference to FIG. 3, which shows an embodiment of the phase discrimination system of the receiver of the invention. FIG. 3 shows the principal part of the phase discrimination system.

In FIG. 3, the same components as shown in FIG. 2 are given the same reference numerals. FIG. 3 includes voltage-controlled oscillators 79 and 80 and frequency divider circuits 81 and 82. As hereinbefore explained, the voltage-controlled oscillator is not provided for the slave receiving means corresponding to the $5f$ received signal and an output may be generated by controlling the phase of the output from the master receiving means corresponding to the master station. The explained embodiment is that providing the voltage-controlled oscillators 79 and 80 which generate the 30F output, 1/5 frequency divider 81 and 1/6 frequency divider 82.

The structure and operation from the input of the received signal to the output of the intermediate frequency amplifiers 4 and 7 are the same in FIGS. 2 and 3. The voltage-controlled oscillators 79 and 80 generate the signals of frequency 30F. The 30F signals are fed to the frequency dividers 81 and 82, respectively, and then divided into 1/5 and 1/6, generating the 6F and 5F signals.

The phase discriminator 35 discriminates the output signal 6F of the divider 81 and the output signal 6F of the intermediate frequency amplifier 4, and then generates an output according to a phase difference. The output of the phase discriminator 35 is smoothed via the low-pass filter 55 and fed back to the voltage-controlled oscillator 79. This controls the oscillation frequency to cause the phase difference output to come close to zero. Thereby, the output signal 30F of the voltage-controlled oscillator 79 is phase-locked to the intermediate frequency signal 6F. As in the receiver of FIG. 1a, the voltage-controlled oscillator 79, frequency divider 81, phase discriminator 35 and low-pass filter 55 constitute the narrow band tracking loop filter.

In the same manner, the voltage-controlled oscillator 80, frequency divider 82, phase discriminator 43 and low-pass filter 56 constitute the narrow band tracking loop filter. The voltage-controlled oscillator 80 generates the output frequency 5F which is phase-locked to the output 5F of the intermediate frequency amplifier 7.

The phase discriminator 54 discriminates the phases of the output signal 30F of the voltage-controlled oscillator 79 with the output signal 30F of the voltage-controlled oscillator 80, and generates an output according to a phase difference. The decometer 41 displays the output.

The phase relation between the output signals of the oscillators 79 and 80 before frequency division and the output signals of the frequency dividers 81 and 82 is determined by the conditions of said frequency dividers at the time of starting operation and is never changed during operation. For this reason, it may be thought that the phase relation between the signals before and after frequency divisions changes for each input of the power source voltage. However, the degree of such change fluctuates at the rate of $2\pi$ radians in terms of the phase of the signal before frequency division, or an integer times one cycle. However, since the phase difference of the received signals in the master and slave receiving means corresponding to the master and slave stations is set within the range of one cycle of the output signals of the voltage-controlled oscillators 79 and 80, any adverse effect is imposed on measurement, and there is no measurement error, even when the phase of the signals changes at the rate of an integer times one cycle.

As hereinbefore explained, since the oscillation frequency of the voltage-controlled oscillator constituting the tracking loop filter is set to the frequency which is an integer times the intermediate frequency of received signal frequency, the phase discrimination of the master and slave receiving means signals corresponding to both master and slave stations may be accomplished without the use of a multiplier.

The foregoing operation is explained in further detail with reference to FIG. 2, wherein the received inputs $6f$ from the master station and $5f$ from the slave stations of the receiving antenna 1 are amplified by the frequency amplifiers 2 and 5, respectively, and mixed with the local oscillation signals 6Δ and 5Δ produced by the dividers 17 and 14 at the mixers 3 and 6, thus producing the intermediate frequency signals 6F and 5F. The intermediate frequency signals 6F and 5F are amplified by the intermediate frequency amplifiers 4 and 7, respectively, and then fed to the phase discriminators 35 and 43, respectively.

Meanwhile, the mixer 37 mixes the signal $f_V$ of the voltage-controlled oscillator 38 and the signal $f_R$ of the local oscillator 19 and generates the frequency difference signal 1080F. The signal 1080F is divided into 1/180 by the frequency divider 36 and then applied to the phase discriminator 35 as the signal 6F. The phase discriminator 35 operates both signals generating an output voltage in accordance with a phase difference. This output is fed back to the voltage-controlled oscillator 38 via the low-pass filter 55 to control the oscillation frequency. The voltage-controlled oscillator 38, mixer 37, frequency divider 36, phase discriminator 35 and low-pass filter 55 constitute the narrow band tracking low-pass filter, as in the system of FIG. 3.

The output signal 1080F of the mixer 37 is multiplied 4 times by the multiplier 39, generating the signal 4320F. The signal 4320F is fed to the voltage-controlled phase shifter 45 and divided into $1/(144\pm 1)$, generating the output signal 30F. The output signal 30F is divided into 1/6 by the frequency divider 44, generating the output signal 5F which is fed to the phase discriminator 43.

The phase discriminator 43 operates on both signals and generates an output according to a phase difference. The output of the phase discriminator 43 is fed back to the voltage-controlled phase shifter 45 via the low-pass filter 56, controlling the frequency division ratio and thereby controlling the output frequency. The voltage-controlled phase shifter 45, frequency divider 44, phase discriminator 43, and low-pass filter 56 constitute in the same manner the narrow band tracking loop filter.

The 1/36 output signal 30F of the frequency divider 36 and the output signal 30F of the voltage-controlled phase shifter 45 are discriminated by the phase discriminator 54, which produces an output according to a phase difference. The decometer 41 displays the output of the phase discriminator 54.

The voltage-controlled oscillator 26 generates the local oscillation signal 1080Δ. This signal is mixed with the signal of the reference oscillator 19 at the mixer 23. Thus, only the desired frequency band is selectively extracted by the low-pass filter 22 and then divided by the variable frequency divider 21. The frequency division ratio of the variable frequency divider 21 may be set externally by the chain selector $S_3$. On the other hand, the fixed frequency divider 20 (1/17050) divides the output signal $f_R$ of the local oscillator 19 at the rate of the fixed division ratio. The output signals of both frequency dividers are discriminated by the phase discriminator 24, thus generating an output voltage according to a phase difference. The output signal of the phase discriminator 24 controls the oscillation frequency of the voltage-controlled oscillator 26 via the low-pass filter 25 and phase-locks it to the frequency of the local oscillator 19.

As hereinbefore explained, the loop including the voltage-controlled oscillator 26 constitutes the synthesizer circuit and generates the local oscillation signal at the constant frequency interval corresponding to the receiving chain. The local oscillation signal 1080Δ generated by the voltage-controlled oscillator 26 is divided by the frequency divider 17 into 1/180 and then divided into 1/216 by the frequency divider 14, generating the signals 6Δ and 5Δ, respectively, which are fed to the mixers 3 and 6, as hereinbefore explained.

The output signal $f_V$ of the voltage-controlled oscillator 38 corresponds to the output of the voltage-controlled oscillator 79 in the embodiment of FIG. 3. In the receiver of the invention, however, the intermediate frequency is usually set very low such as, for example, 5 to 10 kHz, so the frequency drift of the local reference signal $f_R$ of the local oscillator 19 particularly becomes a problem. Therefore, in the embodiment of FIG. 2, the 30F output and 6F output are obtained via the frequency divider 36 from the beat difference between the output signal $f_V$ of the voltage-controlled oscillator 38 and the local reference signal $f_R$.

On the other hand, the voltage-controlled oscillator 26 outputs the 1080Δ signal in synchronization with the output of the local oscillator 19, while the mixer 3 generates the 6F signal from the beat difference between the 6Δ signal obtained by dividing the 1080Δ signal into 1/180 and the received signal $6f$. Therefore, the frequency drift of the local reference signal $f_R$ is cancelled in the phase discriminator 35.

As is obvious from the embodiments of FIGS. 2 and 3, the phase discrimination system of the receiver of the invention does not require a multiplier, but only a frequency divider for detecting a phase difference from the intermediate frequency signal obtained by converting the received signal.

Figure 4:
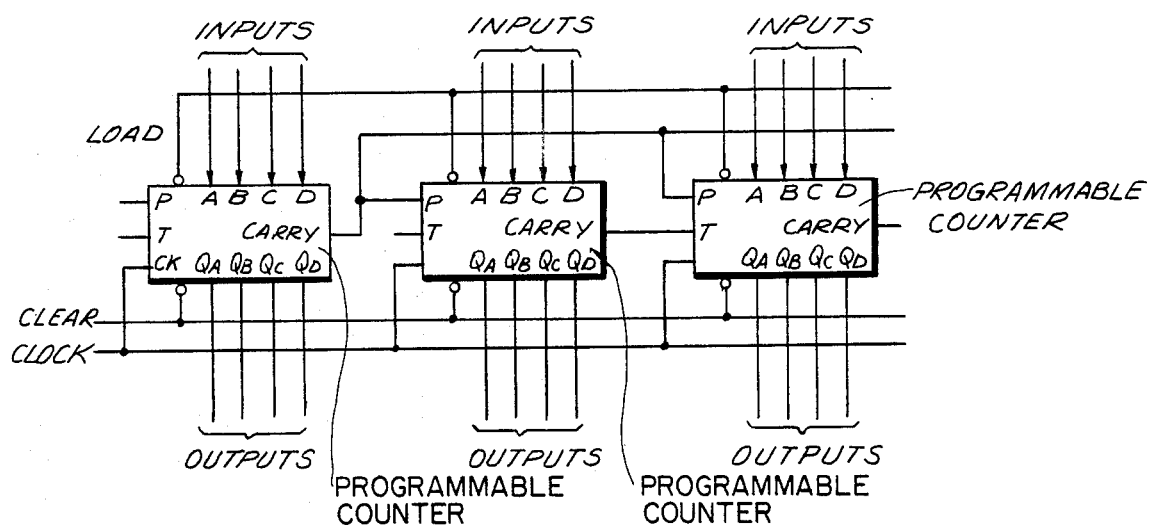
FIG. 4 is a block diagram of an embodiment of the frequency divider of the receiver of FIG. 2.

FIG. 4 shows an embodiment of a frequency divider of the receiver of the invention. The frequency divider shown in FIG. 4 consists of programmable counters in multistage connection, which permits data input previously from the INPUTS and a countdown of a data value via externally fed in clock pulses, or a countup to such data value. The frequency division is provided with the specified frequency division ratio using the clock pulses from the OUTPUTS terminal.

This frequency divider itself is of well known structure, permitting the use of digital IC and adjustment free operation, is very economical, and the division ratio does not vary due to aging fluctuation.

The reference pulse generating operation of the receiver of the invention is explained as follows. FIG. 5 shows the principal portion of the phase reference pulse generator of the receiver of FIG. 2. In FIG. 5, the same components as those of FIG. 2 are identified by the same reference numerals. The 1/6 frequency divider 65 of FIG. 5 provides the functions of both dividers 29 and 33.

When the select switches S$_1$ and S$_2$ are set to the side A "OPERATION" in FIG. 5, the master and slave receiving means, corresponding to the master and slave stations, selectively receive the receiver signals 6f and 5f. A phase difference is displayed, as in FIG. 1a. The 6F signal obtained by dividing the 1080F output of the mixer 37 with the divider 36 is considered to have a constant phase difference of 90° to the 6F signal obtained by converting the received signal with the intermediate frequency signal. When the select switches S$_1$ and S$_2$ are then set to the side B for "REFERENCE" mode, the voltage-controlled oscillator 38 continues to oscillate, maintaining the frequency and phase equal to that immediately before the switching.

Meanwhile, the voltage-controlled phase shifter 30 receives the output of the phase discriminator of the master receiving means of the master station via the low-pass filter 32 and the DC amplifier 31 and the output of said voltage-controlled phase shifter is simultaneously fed again to the phase discriminator 35 via the mixer 28, pulse shaper 27, select switch S$_1$, high frequency amplifier 2, mixer 3, and intermediate frequency amplifier 4. These circuits constitute the phase control loop. Therefore, a phase shift of the voltage-controlled phase shifter 30 is controlled by the output of the phase discriminator 35. Furthermore, the 1F output phase of the voltage-controlled phase shifter 30 is controlled so that the output of the phase discriminator 35 becomes zero, that is, a phase difference between the divided output 6F of the frequency divider 36 and the intermediate frequency 6F of the input signal becomes 90°. The 1F output thus obtained is the same as the 1F output produced by the frequency divider 69 of FIG. 1a.

A monostable multivibrator may be used as the voltagecontrolled phase shifter 30. It is also possible to combine the sawtooth wave oscillator and voltage comparator. FIG. 6 shows an embodiment of the voltage-controlled phase shifter 30. In FIG. 6, the sawtooth wave oscillator is composed of a capacitor C$_2$, a resistor R$_2$, a transistor Q$_1$, a diode CR$_1$ and operational amplifiers A$_1$ and A$_2$. The operational amplifier A$_1$ has a voltage gain of +1 and a high input impedance. The capacitor C$_1$ and the resistor R$_1$ constitute a differential circuit for a square wave for providing a narrow drive pulse for the transistor. The inclination of the sawtooth wave is determined by the values C$_2$ and R$_2$ and the linearity of the inclination is maintained by the positive feedback of the operational amplifier A$_1$ and the current backward-flow preventive diode CR$_1$.

The operational amplifier A$_2$ is for error amplification and its output is applied to one input terminal of a voltage comparator A$_3$. The sawtooth wave output of the operational amplifier A$_1$ is fed to the other input of the voltage comparator A$_3$. The rising phase of the output signal of the voltage comparator A$_3$ may be controlled by slicing the sawtooth wave signal with the error voltage from the low-pass filter 32. A Zener diode CR$_2$ is a DC level converter for slicing the sawtooth wave at the central portion when an error voltage is zero volts.

As hereinbefore explained, the voltage-controlled phase shifter is not required to use especially expensive parts such as a crystal oscillation unit and may be easily constituted with economical parts. Furthermore, the voltage-controlled phase shifter provides an output signal which is the same as the input signal frequency, but is different in phase. This has eliminated the problem of generating a drift of reference signal frequency during the "REFERENCE" mode, as is often observed when a crystal-controlled oscillator is used as in the prior art.

The phase control method of the invention for phase reference is explained as follows. In FIG. 2, the signal from the local oscillator 19 is fed to the frequency divider 20 and the mixer 23. An output of the frequency divider 20 is input to one of the input terminals of the phase discriminator 24. The output signal 1080Δ of the voltage-controlled oscillator 26 is also fed to the mixer 23 and then mixed with said signal, then fed to the low-pass filter 22, divided as specified by the variable frequency divider 21 and then fed to the phase discriminator 24. The output of the phase discriminator 24 controls the 1080Δ signal of the voltage-controlled oscillator 26 after the unwanted element is eliminated by the low-pass filter 25. An output of the oscillator 26 is then fed as an input to the frequency dividers 14 to 17 and then output as local signals of 6Δ, 5Δ, 8Δ and 9Δ. At such time, the frequency division phase is controlled by controlling the division ratio of the divider consisting of a counter. More particularly, when the frequency division ratio is considered as N, the phase is controlled, so that it is led or delayed by 360°/N by changing the division ratio to N−1 or N+1. The control pulse is fed to the frequency dividers 14 to 16 from the microprocessor 64 during the phase reference. The frequency dividers 14 to 16 are thereby preset and the division phase may be uniform.

The foregoing control timing is synchronized with 1Δ obtained by dividing the signal 6Δ via the frequency divider 18. Furthermore, for fine control of phase, the specified resolution is obtained by the use of a delay line provided for the frequency dividers 14 to 16. Generally, an LC passive circuit system is used as the delay line, but it is also possible to use the gate circuit for the semiconductor IC. In other words, a plurality of gate circuits are connected in series and a delay of phase is controlled by changing the number of circuits connected in series. The characteristics of the receiver of the invention are as follows.

(1) Adjustment-free operation may be realized because no multiplier is used, and since phase variation by frequency division is very small, a very stable phase discrimination system may be realized very economically. The variation of rising and falling delay time due to temperature changes of the frequency dividers consisting of digital ICs is usually very small.

(2) The number of expensive voltage-controlled oscillators may be reduced drastically through phase-locking to the received signal or the intermediate frequency signal obtained by converting the received signal via the voltage-controlled phase shifters provided for the slave receiving means corresponding to the slave stations by using one voltage-controlled oscillator for the master receiving means corresponding to the master station.

(3) When the received signal is converted to the intermediate frequency, the specified local oscillation signal MΔ is generated via the frequency divider-phase shifter. Therefore, a small sized and economical system using a microprocessor, just suited for automatic reference, may be provided, where no multiplier is used and phase reference of the master and slave receiving means may be realized using digital ICs. Furthermore, leakage of the local signal may be prevented.

(4) A highly sophisticated oscillator for phase reference and a phase discriminator are no longer necessary because the phase reference pulse may be generated using the voltage-controlled oscillator provided for the master receiving means corresponding to the master station. Furthermore, difficulty due to a pull-in frequency difference which often occurs when two oscillators 19 and 72 are used, as shown in FIG. 1a, may be prevented.

(5) The specified intermediate frequency signal is generated from the beat difference between the output signal $f_V$ of the voltage-controlled oscillator provided for the master receiving - means corresponding to the master station and the output signal $f_R$ of the local oscillator. The frequency drift element of the local oscillator is included in the local oscillation signal which modulates the received signal to the intermediate frequency signal. As a result, the frequency drift of the local oscillator may be mutually cancelled.

As is obvious from the foregoing, the receiver for the hyperbolic navigation system of the invention provides economy and a drastic reduction in size, compared with the receiver of the prior art, and simultaneously permits the location of a ship, or the like, with high accuracy by utilizing digital ICs.

While the invention has been described by means of a specific example and in a specific embodiment, we do not wish to be limited thereto, for obvious modifications will occur to those skilled in the art without departing from the spirit and scope of the invention.

We claim:

1. A hyperbolic navigation receiver, comprising master receiving means corresponding to a master station and a plurality of slave receiving means corresponding to a plurality of slave stations, each of said master and slave receiving means having receiving means for receiving and distinguishing incoming signals from said master and slave stations, and a tracking loop filter having an output and including first generating means for generating a multifrequency signal corresponding to a frequency of said receiving means, said first generating means having an input and an output and providing at said output an output signal which is the output signal of said tracking loop filter, the first gnerating means of said master receiving means comprising a first voltage-controlled oscillator and the first generating means of each of said slave receiving means comprising a first voltage-controlled phase shifter electrically connected to the output of said tracking loop filter of said master receiving means, first dividing means electrically connected to said first generating means for dividing an output signal of said first generating means to the frequency of an incoming signal from said receiving means, said first dividing means producing an output signal, and first phase discriminating means electrically connected to said first dividing means for phase discriminating the output signal of said first dividing means from said incoming signal of said receiving means, said first phase discriminating means having an output connected to the input of said of said first generating means and producing at said output an output signal according to which said multifrequency signal is controlled, second phase discriminating means electrically connected to said first generating means of said tracking loop filter for phase discriminating the output signal of said tracking loop filter of said master receiving means from each of the output signals of said tracking loop filters of said slave receiving means, said second phase discriminating means having an output and producing at said output an output signal for microprocessing, and second generating means for generating a local multifrequency signal, said second generating means being self-oscillating and each of said receiving means of said slave receiving means further including second dividing means electrically connected to said second generating means for dividing said local multifrequency signal in accordance with the incoming frequency of a received signal from said master and slave stations, said second dividing means producing an output signal, and first mixing means electrically connected to said second generating means and said second dividing means for mixing said received signal with the output signal of said second dividing means for converting to an intermediate frequency signal.

2. A hyperbolic navigation receiver as claimed in claim 1, wherein the first generating means of said master receiving means further comprises second mixing means electrically connected to said first voltage-controlled oscillator and to aid in cancelling frequency drift.

3. A hyperbolic navigation receiver as claimed in claim 1, wherein said receiver includes means for operating it in a selected one of an operation mode and a reference mode and wherein said master receiving means has cutting means for cutting off the loop connection of said tracking loop filter and further comprising a voltage-controlled phase shifter electrically connected to said first dividing means and electrically coupled to said first phase discriminating means, said first dividing means supplying a signal of said master receiving emans to said voltage-controlled phase shifter as an input signal, said voltage-controlled phase shifter being controlled by the output signal of said first phase discriminating means of said master receiving means, third dividing means electrically connected to said voltage-controlled phase shifter for dividing one of the output signal and input signal of said voltage-controlled phase shifter to a basic intermediate frequency signal, second mixing means electrically connected to said third dividing means and electrically connected to said second generating means for mixing said basic intermediate frequency signal with a local basic frequency signal, said second mixing means oproviding an output signal, and electrically conductive means electrically connecting said second mixing means to said first mixing means of said master and slave receiving means for supplying the output signal of said second mixing means to said first mixing means of said master and slave receiving means during operation in the reference mode.

4. A hyperbolic navigation receivier as claimed in claim 3, wherein said receiver has an initial circuit condition and said second dividing means has control means for controlling the initial condition and a dividing ratio for phase reference of an output signal of each of said first mixing means.

5. A hyperbolic navigation receiver as claimed in claim 1, wherein said second generating means comprises a second voltage-controlled oscillator and oscillating means electrically connected to said second voltage-controlled oscillator for providing an oscillating output signal of a predetermined frequency for controlling said second voltage-controlled oscillator, and said first generating means of said master receiving means comprises mixing means electrically connected to said first voltage-controlled oscillator and said oscillating means for mixing the output signal of said first voltage-controlled oscillator with the output signal of said oscillating means.

* * * * *